(12) United States Patent
Cai et al.

(10) Patent No.: US 12,400,922 B2
(45) Date of Patent: *Aug. 26, 2025

(54) ELECTRONIC COMPONENT PACKAGE

(71) Applicant: TDK CORPORATION, Tokyo (JP)

(72) Inventors: Yongfu Cai, Tokyo (JP); Shuhei Miyazaki, Tokyo (JP); Kazuma Yamawaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 225 days.

This patent is subject to a terminal disclaimer.

(21) Appl. No.: 18/090,664

(22) Filed: Dec. 29, 2022

(65) Prior Publication Data
US 2023/0140621 A1 May 4, 2023

Related U.S. Application Data

(63) Continuation of application No. 16/407,623, filed on May 9, 2019, now Pat. No. 11,569,143.

(30) Foreign Application Priority Data

Jul. 27, 2018 (JP) .................. 2018-141111

(51) Int. Cl.
*H01L 23/28* (2006.01)
*H01L 23/00* (2006.01)
*H01L 23/498* (2006.01)

(52) U.S. Cl.
CPC ........ *H01L 23/28* (2013.01); *H01L 23/49838* (2013.01); *H01L 24/32* (2013.01);
(Continued)

(58) Field of Classification Search
CPC .......... H01L 24/32; H01L 24/48; H01L 24/85
See application file for complete search history.

(56) References Cited

U.S. PATENT DOCUMENTS 3,988,536 A * 10/1976 Moricca ................. H04N 3/12
348/E3.012
6,927,482 B1 * 8/2005 Kim ..................... B81C 1/0023
257/680

(Continued)

FOREIGN PATENT DOCUMENTS

JP   H07-335826 A   12/1995
JP   2001-015644 A   1/2001
(Continued)

*Primary Examiner* — Jeff W Natalini
*Assistant Examiner* — Alexander Belousov
(74) *Attorney, Agent, or Firm* — Oliff PLC

(57) ABSTRACT

An electronic component package of an embodiment of the disclosure includes a base, a first plated layer, a first electronic component chip, a second plated layer, and a second electronic component chip. The base includes a first surface and a second surface. The first plated layer covers the first surface. The first electronic component chip is provided on the first plated layer with a first insulating layer being interposed therebetween. The second plated layer covers the second surface. The second electronic component chip is provided on the second plated layer with a second insulating layer being interposed therebetween. The first plated layer and the second plated layer each include a first metal material that is less likely to undergo an ion migration phenomenon than silver (Ag).

27 Claims, 6 Drawing Sheets

(52) U.S. Cl.
CPC .............. *H01L 24/48* (2013.01); *H01L 24/73* (2013.01); *H01L 24/85* (2013.01); *H01L 2224/45144* (2013.01); *H01L 2224/48091* (2013.01); *H01L 2224/48247* (2013.01); *H01L 2224/73265* (2013.01); *H01L 2924/14* (2013.01)

(56) References Cited

U.S. PATENT DOCUMENTS

| | | | |
|---|---|---|---|
| 6,943,061 B1 * | 9/2005 | Sirinorakul | H01L 24/29 438/126 |
| 6,953,986 B2 * | 10/2005 | Abbott | C25D 5/34 257/677 |
| 10,308,502 B2 * | 6/2019 | Otte | G01L 9/0054 |
| 11,569,143 B2 * | 1/2023 | Cai | H01L 23/49575 |
| 2002/0109217 A1 * | 8/2002 | Nam | H01L 23/49562 257/E23.044 |
| 2002/0125555 A1 * | 9/2002 | Akiyama | H01L 25/162 257/692 |
| 2004/0070083 A1 * | 4/2004 | Su | H01L 25/0657 257/E25.023 |
| 2004/0208210 A1 * | 10/2004 | Inoguchi | H01L 24/97 257/E33.072 |
| 2010/0007007 A1 * | 1/2010 | Yoon | H01L 23/3171 257/788 |
| 2012/0250195 A1 * | 10/2012 | Chang | H02H 9/046 361/56 |
| 2014/0374890 A1 * | 12/2014 | Yamashita | H01L 24/92 438/107 |
| 2020/0035574 A1 * | 1/2020 | Cai | H01L 24/73 |
| 2023/0140621 A1 * | 5/2023 | Cai | H01L 23/49582 257/734 |

FOREIGN PATENT DOCUMENTS

| | | |
|---|---|---|
| JP | 2001-185670 A | 7/2001 |
| JP | 2011-071566 A | 4/2011 |
| JP | 2017-173310 A | 9/2017 |
| JP | 2017-191093 A | 10/2017 |
| KR | 2010-0006104 A | 1/2010 |

* cited by examiner

ELECTRONIC COMPONENT PACKAGE

CROSS REFERENCE TO RELATED APPLICATIONS

This application is a continuation application of U.S. patent application Ser. No. 16/407,623, filed May 9, 2019, which claims the benefit of Japanese Priority Patent Application No. 2018-141111 filed on Jul. 27, 2018, the entire contents of each of which are incorporated herein by reference.

BACKGROUND

The disclosure relates to an electronic component package in which a single lead frame is provided with two or more electronic component chips.

Recently, there has been proposed a technique that intends to achieve redundancy of an operation system in an electronic component package such as a sensor unit to be mounted, for example, on an electronic apparatus. For example, reference is made to Japanese Unexamined Patent Application Publication No. 2017-191093.

SUMMARY

An electronic component package according to one embodiment of the disclosure includes a base, a first plated layer, a first electronic component chip, a second plated layer, and a second electronic component chip. The base includes a first surface and a second surface. The first plated layer covers the first surface. The first electronic component chip is provided on the first plated layer with a first insulating layer being interposed therebetween. The second plated layer covers the second surface. The second electronic component chip is provided on the second plated layer with a second insulating layer being interposed therebetween. The first plated layer and the second plated layer each include a first metal material that is less likely to undergo an ion migration phenomenon than silver (Ag).

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the disclosure.

DETAILED DESCRIPTION

Figure 1:
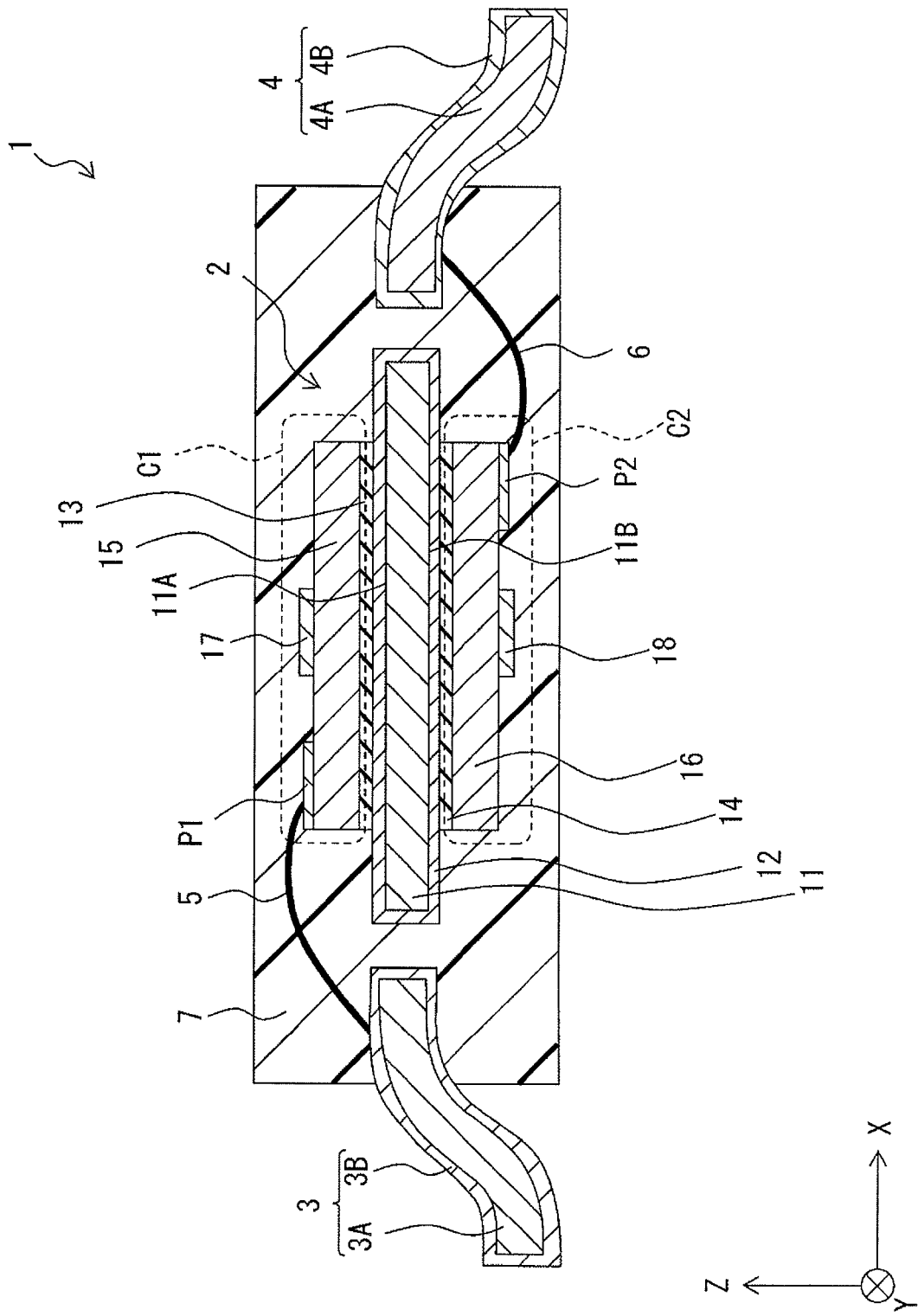
FIG. 1 is a cross-sectional view of an overall configuration example of a sensor package according to one embodiment of the disclosure.

Some embodiments of the disclosure are described below in detail with reference to the accompanying drawings.

Incidentally, an electronic component package has been increasingly requested to have further improved operational reliability.

It is desirable to provide an electronic component package having much superior operational reliability.

It is to be noted that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. It is to be noted that the like elements are denoted with the same reference numerals, and any redundant description thereof will not be described in detail. It is to be noted that the description is given in the following order.

1. Example Embodiment

An example of a sensor package including a sensor module in which paired sensor chips are provided on respective both surfaces of a base covered with an integrated plated layer, with respective insulating layers being interposed therebetween.

2. Modification Examples 2.1 An example of a sensor package including a sensor module in which paired sensor chips are provided on respective both surfaces of a base, with respective plated layers and respective insulating layers being interposed therebetween.

2.2 An example of a sensor package including a sensor module in which paired sensor chips are provided on one surface of a base covered with a plated layer, with a common insulating layer being interposed therebetween.

2.3 An example of a sensor package including a sensor module in which paired sensor chips are provided on respective both surfaces of a base not covered with a plated layer, with respective insulating layers being interposed therebetween.

2.4 An example of a sensor package in which a mold has a void therein and components such as a sensor is disposed in the void.

3. Other Modification Examples

1. Example Embodiment

[Configuration of Sensor Package 1]

First, description is given, with reference to FIG. 1, of a configuration of a sensor package 1 according to one example embodiment of the disclosure. FIG. 1 is a schematic cross-sectional view of an overall configuration example of the sensor package 1. The sensor package 1 may be, for example, a magnetic sensor that detects a variation in a magnetic field. The sensor package 1 is a specific but non-limiting example corresponding to an "electronic component package" in one embodiment of the disclosure.

As illustrated in FIG. 1, the sensor package 1 may include a sensor module 2, leads 3 and 4, and wires 5 and 6. The sensor module 2, the leads 3 and 4, and the wires 5 and 6 may be embedded in a mold 7. It is to be noted that one end of each of the leads 3 and 4 may be embedded in the mold 7, and that the other end of each of the leads 3 and 4 may be led to the outside of the mold 7. The mold 7 may be configured by an insulating resin, for example. Non-limiting examples of the insulating resin may include a thermosetting resin in which a silica filler as a filling material is mainly dispersed in an epoxy resin as a matrix resin. Further, the mold 7 is a specific but non-limiting example corresponding to a "protective film" in one embodiment of the disclosure. Besides the above-described insulating resin, ceramic or glass may be used as a constituent material of the "protective film" in one embodiment of the disclosure.

[Configuration of Sensor Module 2]

Figure 2:
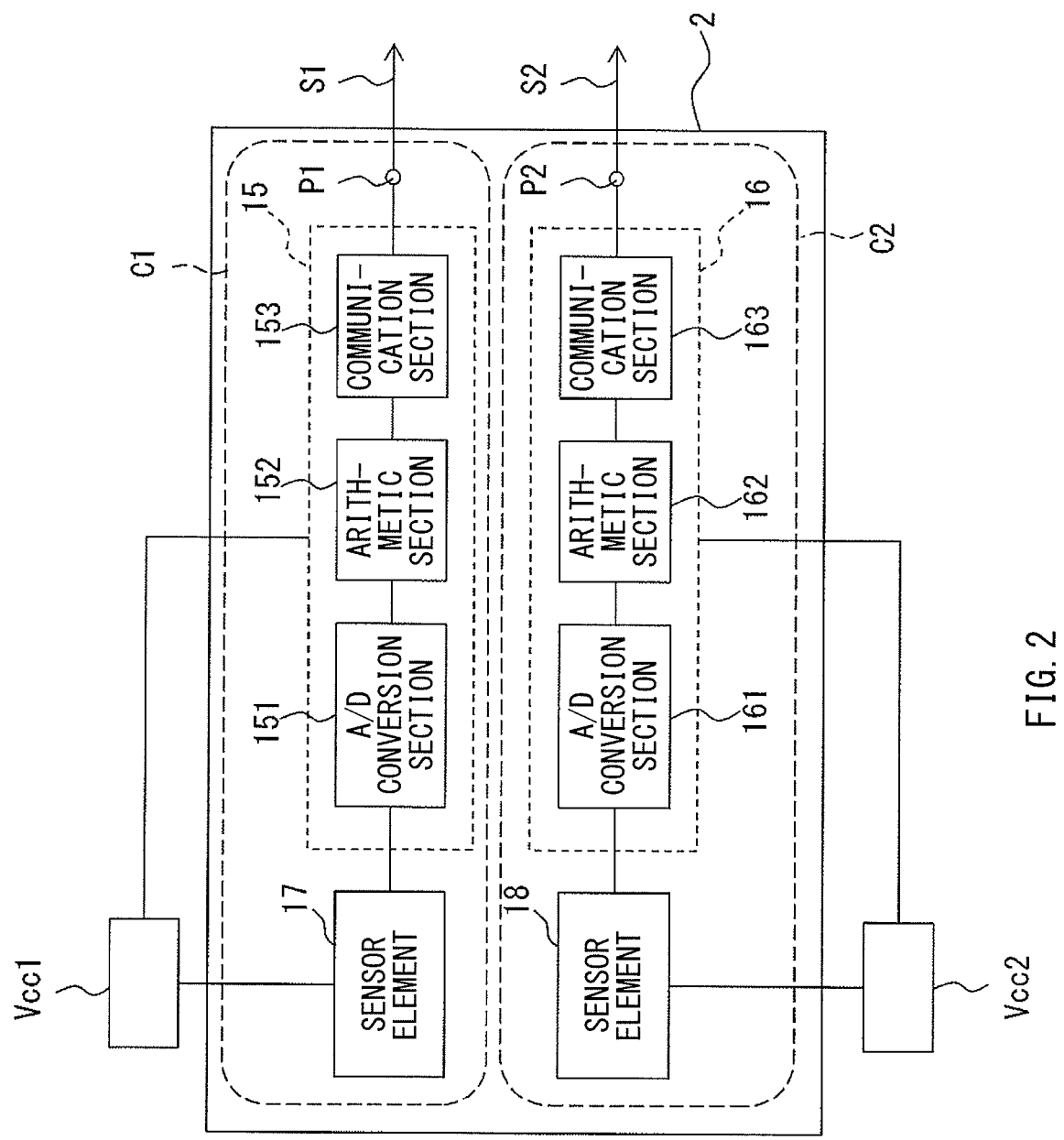
FIG. 2 is a block diagram illustrating a configuration example of a sensor module illustrated in FIG. 1.

As illustrated in FIG. 1, the sensor module 2 includes a base 11, a plated layer 12, an insulating layer 13, an insulating layer 14, an electronic component chip C1, and an electronic component chip C2. A block diagram of FIG. 2 illustrates a configuration example of the sensor module 2.

[Base 11]

The base 11 may be, for example, a plate member or a foil member including an electrically conductive material such as copper. The base 11 may include a surface 11A and a surface 11B that are located on sides opposite to each other.

[Plated Layer 12]

The plated layer 12 may be a coated film including a metal material. The plated layer 12 may integrally cover a surface of the base 11 that includes the surface 11A and the surface 11B.

The plated layer 12 includes, for example, a metal material that is less likely to undergo an ion migration phenomenon than silver (Ag). In a specific but non-limiting example, the plated layer 12 may include, for example, a metal material that includes one or more of gold (Au), palladium (Pd), and nickel (Ni). The plated layer 12 either may have a single-layer structure including the above-described metal material, or may have a multi-layer structure in which a plurality of layers is stacked. In an example embodiment, the multi-layer structure may be, for example, an Ni/Au two-layer structure, an NiP/Au two-layer structure, or an Ni/Pd/Au three-layer structure. The plated layer 12 is a specific but non-limiting example corresponding to an integrated component of a "first plated layer" and a "second plated layer" in one embodiment of the disclosure.

Evaluation of the plated layer 12 concerning the ion migration may be able to be performed, for example, using an unsaturated pressurized water vapor test referred to as highly accelerated temperature humidity stress test (HAST). Specific test conditions are specified, for example, in International Electrotechnical Commission (IEC) standard No. 60068-2-66-60749. The "metal material that is less likely to undergo an ion migration phenomenon than silver (Ag)" referred to as in the present example embodiment is a metal material that takes long time until breakdown or that does not undergo breakdown in the following cases. The cases include a case where HAST is carried out for 192 hours within a temperature range of 110±2° C. and within a humidity range of 85±5% RH and a case where HAST is carried out for 96 hours within a temperature range of 130±2° C. and within a humidity range of 85±5% RH.

[Insulating Layer 13 and Insulating Layer 14]

The insulating layer 13 may be provided on a portion, of the plated layer 12, that covers the surface 11A of the base 11. Meanwhile, the insulating layer 14 may be provided on a portion, of the plated layer 12, that covers the surface 11B of the base 11. The insulating layer 13 and the insulating layer 14 may be each an insulating adhesive film, i.e., a die attach film (DAF), for example. The insulating layer 13 and the insulating layer 14 may therefore couple and fix, respectively, the electronic component chip C1 and the electronic component chip C2 to the base 11 covered with the plated layer 12. The electronic component chip C1 and the electronic component chip C2 may be electrically isolated from each other because of presence of the insulating layer 13, the insulating layer 14, and the mold 7 that seals the entire sensor module 2.

[Electronic Component Chip C1 and Electronic Component Chip C2]

As illustrated in FIG. 1, the electronic component chip C1 is provided on the plated layer 12 with the insulating layer 13 being interposed therebetween. As illustrated in FIGS. 1 and 2, the electronic component chip C1 may include an application specific integrated circuit (ASIC) 15, a sensor element 17, and a pad P1. Although not illustrated, the sensor element 17 and the ASIC 15 may be electrically coupled to each other. Further, as illustrated in FIG. 1, the electronic component chip C2 is provided on the plated layer 12 with the insulating layer 14 being interposed therebetween. As illustrated in FIGS. 1 and 2, the electronic component chip C2 may include an ASIC 16, a sensor element 18, and a pad P2. Although not illustrated, the sensor element 18 and the ASIC 16 may be electrically coupled to each other. For example, an electrically conductive wire and an electrically conductive thin film such as a plated film may be used to electrically couple the sensor element 18 and the ASIC 16. The electrically conductive wire and the electrically conductive thin film may each include metal such as gold (Au), aluminum (Al), and copper (Cu), for example. Further, as illustrated in FIG. 2, a power supply Vcc1 that supplies power to the electronic component chip C1 may be coupled to the electronic component chip C1, and a power supply Vcc2 that supplies power to the electronic component chip C2 may be coupled to the electronic component chip C2. The power supply Vcc1 may be coupled to each of the ASIC 15 and the sensor element 17 in the electronic component chip C1. The power supply Vcc2 may be coupled to each of the ASIC 16 and the sensor element 18 in the electronic component chip C2.

The electronic component chip C1, the ASIC 15, and the sensor element 17 are specific but non-limiting examples corresponding, respectively, to a "first electronic component chip", a "first application specific integrated circuit", and a "first sensor" in one embodiment of the disclosure. Likewise, the electronic component chip C2, the ASIC 16, and the sensor element 18 are specific but non-limiting examples corresponding, respectively, to a "second electronic component chip", a "second application specific integrated circuit", and a "second sensor" in one embodiment of the disclosure.

[Sensor Element 17 and Sensor Element 18]

The sensor element 17 and the sensor element 18 may be each, for example, a magnetic sensor that detects a variation in an external magnetic field in association with displacement of a magnetic body. Non-limiting examples of the sensor element 17 and the sensor element 18 may include a Hall element, an anisotropic magneto-resistive effect (AMR) element, a giant magneto-resistive effect (GMR) element, and a tunnel magneto-resistive effect (TMR) element. The sensor element 17 and the sensor element 18 may transmit, respectively, toward the ASIC 15 and the ASIC 16, a detection signal in association with the variation in the external magnetic field.

[ASIC 15 and ASIC 16]

As illustrated in FIG. 2, the ASIC 15 may include, for example, an A/D conversion section 151, an arithmetic section 152, and a communication section 153. The A/D conversion section 151 may perform digital conversion of a detection signal supplied from the sensor element 17, and may output the digital-converted detection signal to the arithmetic section 152. The arithmetic section 152 may determine, for example, an amount of displacement of the magnetic body through an arithmetic operation on the basis of the digital-converted detection signal supplied from the sensor element 17. The arithmetic section 152 may thereafter output a result of the arithmetic operation to the communication section 153. The communication section 153 may generate an output signal of the arithmetic result supplied from the arithmetic section 152, and may output the generated output signal to the outside through the pad P1. Likewise, the ASIC 16 may include, for example, an A/D conversion section 161, an arithmetic section 162, and a communication section 163. The A/D conversion section 161 may perform digital conversion of a detection signal supplied from the sensor element 18, and may output the digital-converted detection signal to the arithmetic section 162. The arithmetic section 162 may determine, for example, an amount of displacement of the magnetic body through an arithmetic operation on the basis of the digital-converted detection signal supplied from the sensor element 18. The arithmetic section 162 may thereafter output a result of the arithmetic operation to the communication section 163. The communication section 163 may generate an output signal of the arithmetic result supplied from the arithmetic section 162, and may output the generated output signal to the outside through the pad P2.

The lead 3 may be an electrically conductive member used to derive the output signal supplied from the electronic component chip C1 to the outside. The lead 3 may include, for example, a core 3A including a highly electrically conductive material such as copper (Cu) and a cladding 3B covering a circumference of the core 3A. The cladding 3B may be, for example, a plated layer having the same structure as that of the plated layer 12. The one end of the lead 3 embedded in the mold 7 may be coupled to the pad P1 through the wire 5.

The lead 4 may be an electrically conductive member used to derive the output signal supplied from the electronic component chip C2 to the outside. The lead 4 may include, for example, a core 4A including a highly electrically conductive material such as copper (Cu) and a cladding 4B covering a circumference of the core 4A. The cladding 4B may be, for example, a plated layer having the same structure as that of the plated layer 12. The one end of the lead 4 embedded in the mold 7 may be coupled to the pad P2 through the wire 6.

[Effects of Sensor Package 1]

In the sensor package 1, the single base 11 may be provided with the electronic component chip C1 and the electronic component chip C2 that are electrically insulated from each other. Further, the electronic component chip C1 and the electronic component chip C2 may be supplied with power, respectively and separately, from the power supply Vcc1 and the power supply Vcc2 that are different from each other. This enables the electronic component chip C1 and the electronic component chip C2 to detect, independently of each other, the variation in the external magnetic field, that affects the sensor package 1, in association with the displacement of the magnetic body, for example. Hence, the sensor package 1 achieves redundancy of an operation system. That is, for example, it is possible for the sensor package 1 to cause only the electronic component chip C1 to operate in normal time and to cause the electronic component chip C2 to stand by as a backup. In a case where the electronic component chip C1 is suspected to be broken down, it is possible for the sensor package 1 to cause the electronic component chip C2 as the backup to operate.

Further, in the sensor package 1, the surface of the base 11, i.e., the surface 11A and the surface 11B may be covered with the plated layer 12 including the metal material that is less likely to undergo the ion migration phenomenon than silver (Ag). Here, difference in working voltages between the electronic component chip C1 and the electronic component chip C2 results in occurrence of difference in electric potentials between the ASIC 15 of the electronic component chip C1 and the ASIC 16 of the electronic component chip C2. Under such a circumstance, in a case where, for example, the plated layer 12 is configured by a metal material including silver (Ag), there is a concern that the ion migration phenomenon may occur depending on temperature conditions or humidity conditions. In other words, there is a possibility that silver (Ag) included in the plated layer 12 may be permeated through the insulating layer 13 or the insulating layer 14 to move to the ASIC 15 or the ASIC 16. The occurrence of such ion migration impairs electric insulation of each of the insulating layer 13 and the insulating layer 14, causing occurrence of a leakage current, thus making it difficult to expect a normal operation in each of the electronic component chip C1 and the electronic component chip C2. Meanwhile, in the sensor package 1 of the present embodiment, the above-mentioned metal material that configures the plated layer 12 is less likely to infiltrate into the insulating layer 13 and the insulating layer 14 to damage the insulation of the insulating layer 13 and the insulating layer 14, as compared with a case where the plated layer 12 is configured by silver (Ag). Accordingly, even in a case where there is a difference in the working voltages between the electronic component chip C1 and the electronic component chip C2, a normal operation is maintained in each of the electronic component chip C1 and the electronic component chip C2. Hence, the sensor package 1 has much superior operational reliability.

2. Modification Examples 2.1 First Modification Example

[Configuration of Sensor Package 1A]

Figure 3:
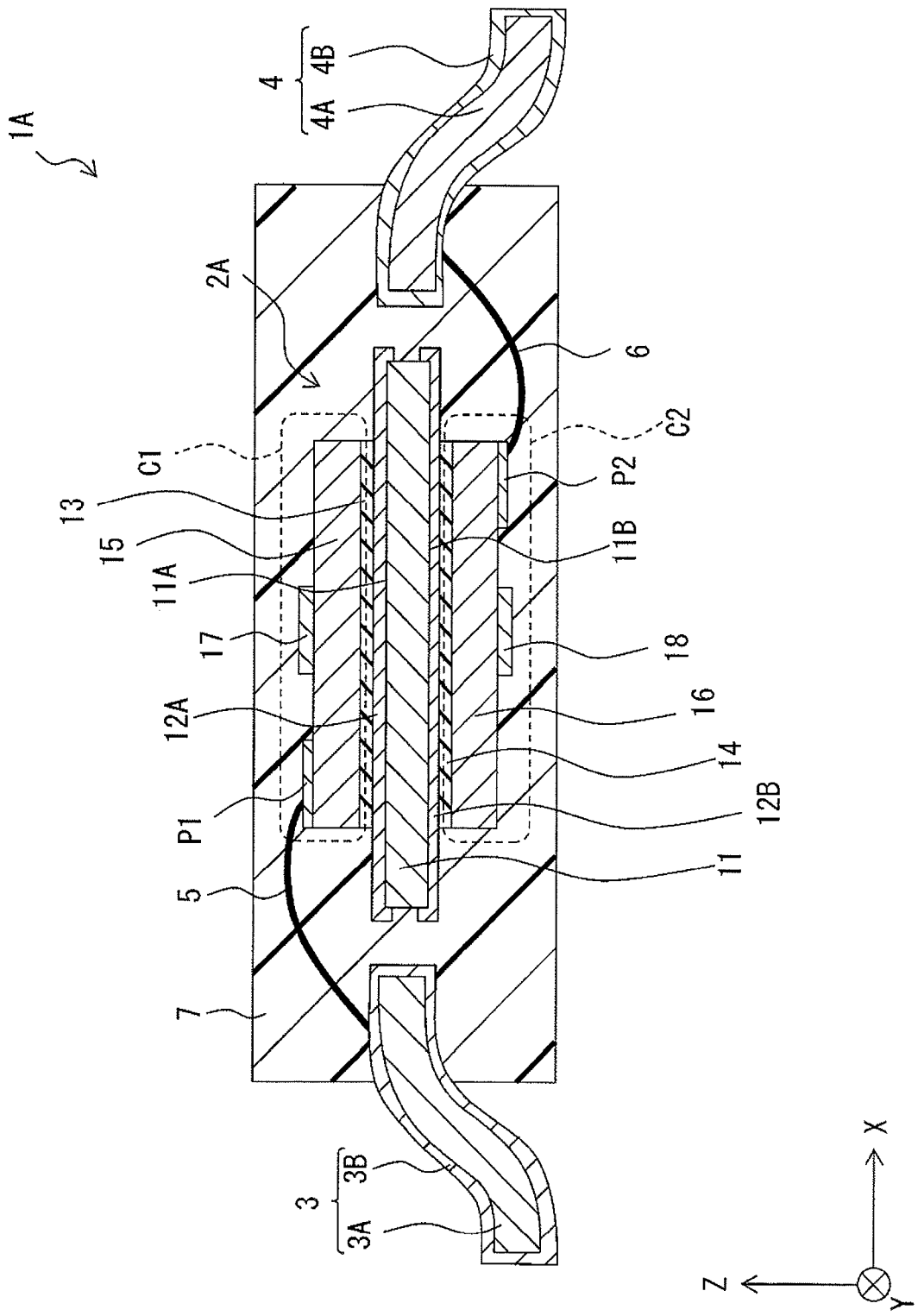
FIG. 3 is a cross-sectional view of an overall configuration of a sensor package according to a first modification example of the disclosure.

FIG. 3 is a cross-sectional view of an overall configuration example of a sensor package 1A according to a first modification example of the disclosure. The sensor package 1 according to the foregoing example embodiment includes the plated layer 12 that integrally covers the circumference of the base 11. Meanwhile, a sensor module 2A of the sensor package 1A according to the present modification example includes, for example, a plated layer 12A and a plated layer 12B that are provided separately from each other. The plated layer 12A covers the surface 11A that is a front surface of the base 11. The plated layer 12B covers the surface 11B that is a rear surface of the base 11. Except this point, the sensor package 1A has substantially the same configuration as that of the sensor package 1.

[Workings and Effects of Sensor Package 1A]

It is also possible for the sensor package 1A according to the present modification example to achieve effects similar to those of the sensor package 1 of the foregoing example embodiment. Moreover, the sensor package 1A according to the present modification example includes the plated layer 12A and the plated layer 12B that are separated from each other. This makes it possible for the plated layer 12A and the plated layer 12B to include constituent materials that are different from each other. It is also possible to form the plated layer 12A and the plated layer 12B in separate processes.

2.2 Second Modification Example

[Configuration of Sensor Package 1B]

Figure 4:
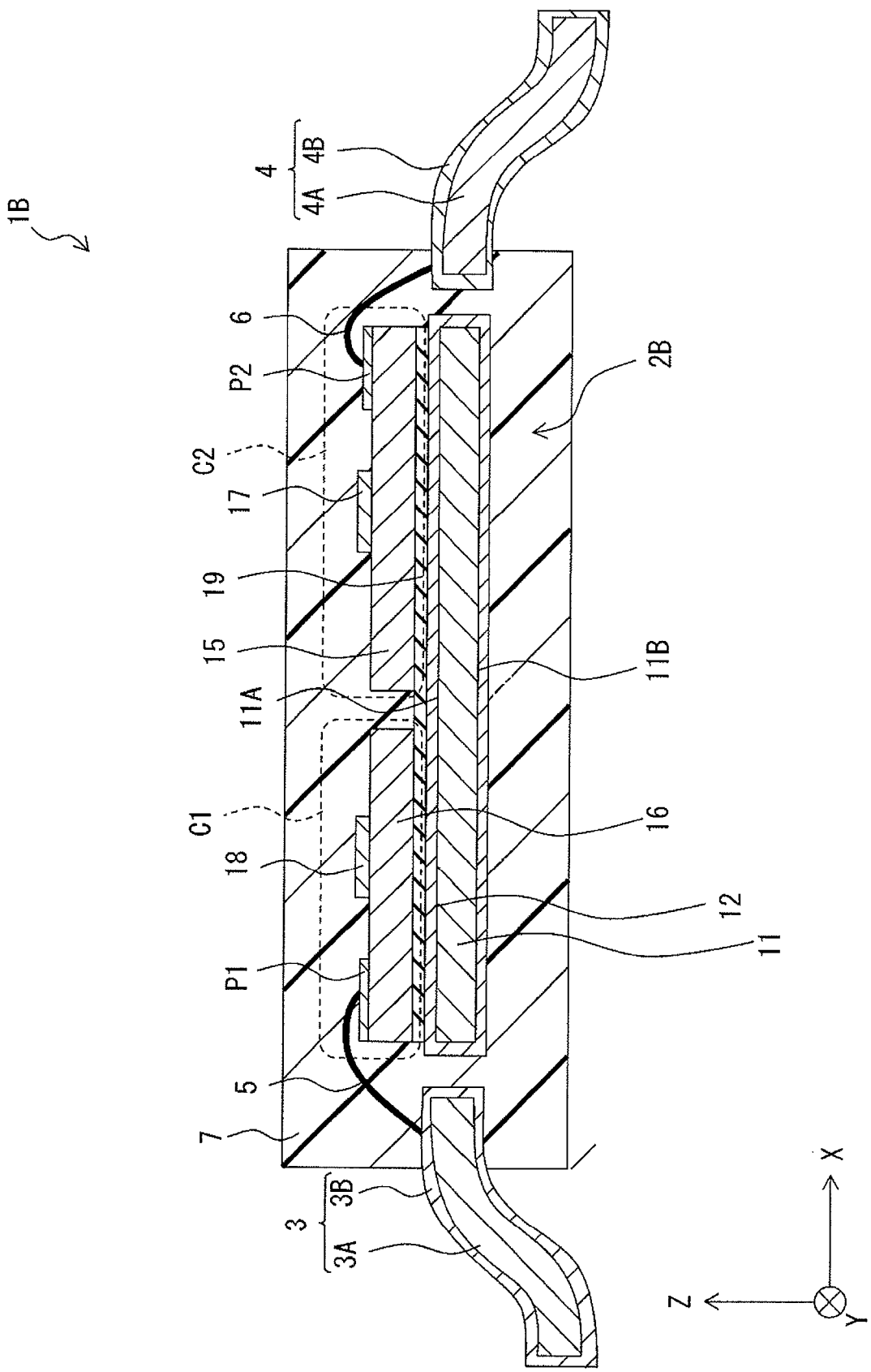
FIG. 4 is a cross-sectional view of an overall configuration of a sensor package according to a second modification example of the disclosure.

FIG. 4 is a cross-sectional view of an overall configuration example of a sensor package 1B according to a second modification example of the disclosure. In the sensor package 1 according to the foregoing example embodiment, the electronic component chip C1 is provided on the one surface 11A of the base 11, and the electronic component chip C2 is provided on the other surface 11B of the base 11. Meanwhile, in a sensor module 2B of the sensor package 1B according to the present modification example, both of the electronic component chip C1 and the electronic component chip C2 may be provided on the surface 11A with a single insulating layer 19 being interposed therebetween. Except this point, the sensor package 1B has substantially the same configuration as that of the sensor package 1.

[Workings and Effects of Sensor Package 1B]

It is also possible for the sensor package 1B according to the present modification example to achieve effects similar to those of the sensor package 1 of the foregoing example embodiment. In addition, according to the sensor package 1B, it is possible to make its thickness smaller than a thickness of the sensor package 1.

2.3 Third Modification Example

[Configuration of Sensor Package 1C]

Figure 5:
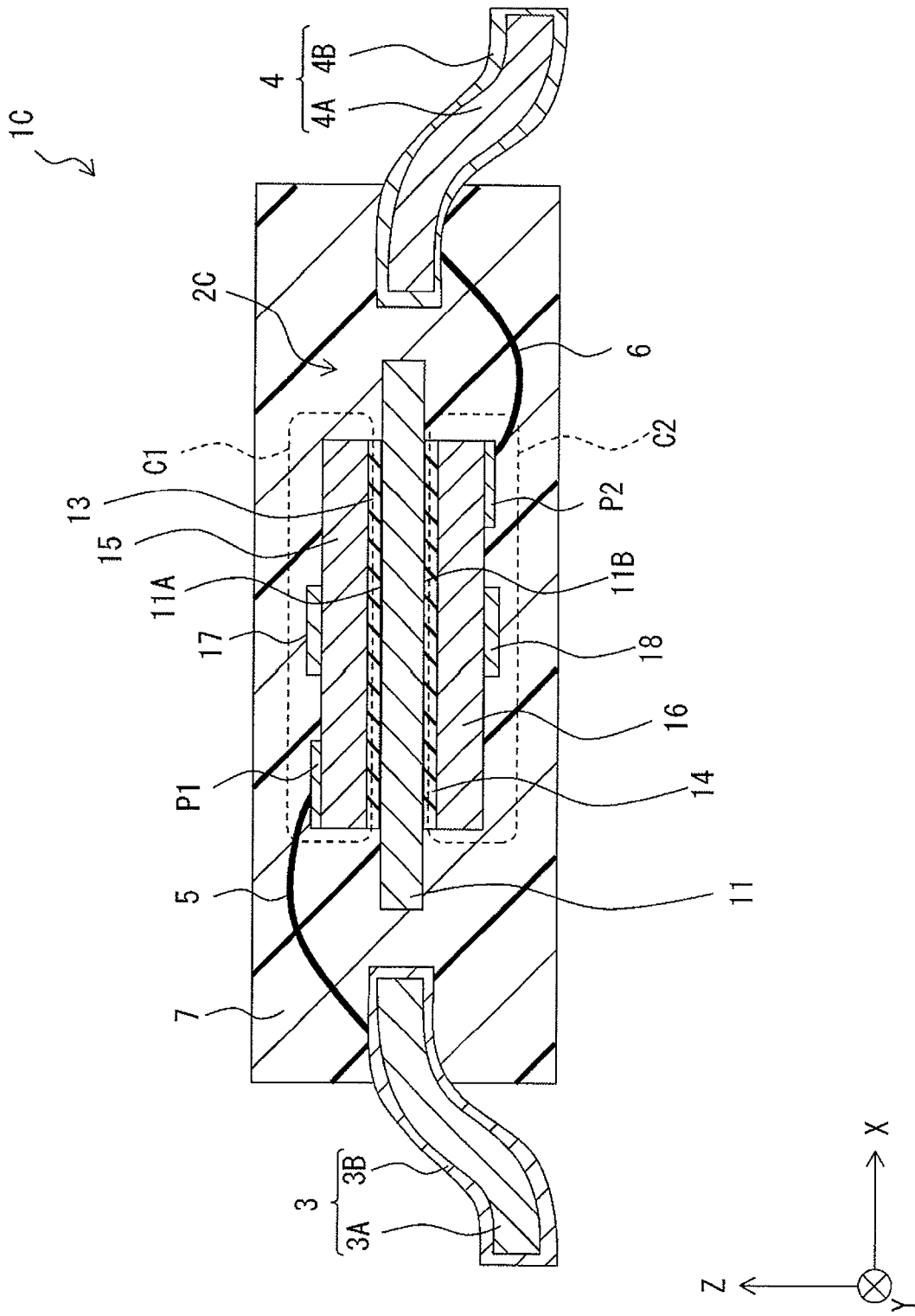
FIG. 5 is a cross-sectional view of an overall configuration of a sensor package according to a third modification example of the disclosure.

FIG. 5 is a cross-sectional view of an overall configuration example of a sensor package 1C according to a third modification example of the disclosure. In the sensor package 1 according to the foregoing example embodiment, the plated layer 12 is provided to cover the base 11, and the electronic component chip C1 and the electronic component chip C2 are provided on the plated layer 12. Meanwhile, in a sensor module 2C of the sensor package 1C according to the present modification example, the electronic component chip C1 is provided on the surface 11A with the insulating layer 13 being interposed therebetween, and the electronic component chip C2 is provided on the surface 11B with the insulating layer 14 being interposed therebetween. Except this point, the sensor package 1C has substantially the same configuration as that of the sensor package 1.

[Workings and Effects of Sensor Package 1C]

It is also possible for the sensor package 1C according to the present modification example to achieve effects similar to those of the sensor package 1. That is, in the sensor package 1C, the single base 11 is provided with the electronic component chip C1 and the electronic component chip C2 that are electrically insulated from each other. Further, the electronic component chip C1 and the electronic component chip C2 may be supplied with power, respectively and separately, from the power supply Vcc1 and the power supply Vcc2 that are different from each other. This makes it possible to detect, independently of each other, the variation in the external magnetic field, that affects the sensor package 1C, in association with the displacement of the magnetic body, for example. Hence, the sensor package 1C achieves redundancy of an operation system. That is, for example, it is possible for the sensor package 1C to cause only the electronic component chip C1 to operate in normal time and to cause the electronic component chip C2 to stand by as a backup. In a case where the electronic component chip C1 is suspected to be broken down, it is possible for the sensor package 1C to cause the electronic component chip C2 as the backup to operate.

Further, in the sensor package 1C according to the present modification example, the insulating layers 13 and 14 may be provided without covering the surface of the base 11, i.e., the surface 11A and the surface 11B with a plated layer. This prevents or suppresses short circuit, caused by the phenomenon of ion migration of a metal that constitutes the plated layer, between the base 11 and each of the electronic component chip C1 and the electronic component chip C2.

2.4 Fourth Modification Example

[Configuration of Sensor Package 1D]

Figure 6:
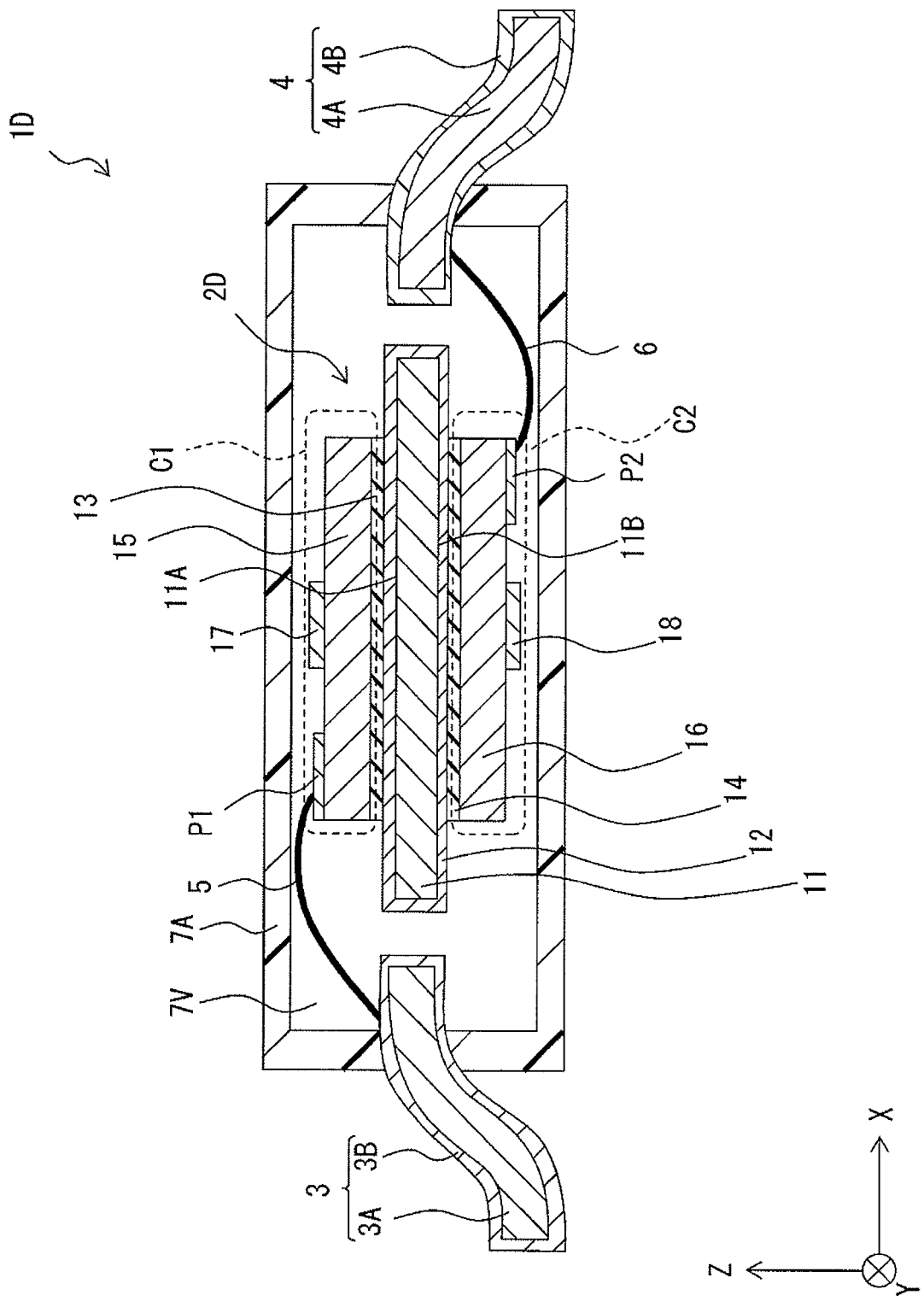
FIG. 6 is a cross-sectional view of an overall configuration of a sensor package according to a fourth modification example of the disclosure.

FIG. 6 is a cross-sectional view of an overall configuration example of a sensor package 1D according to a fourth modification example of the disclosure. In the sensor package 1 according to the foregoing example embodiment, components such as the sensor module 2 may be closely covered with the mold 7. Meanwhile, in the sensor package 1D according to the present modification example, a mold 7A may have a void 7V therein, and the sensor module 2 and the wires 5 and 6 may be provided in the void 7V. Except this point, the sensor package 1D has substantially the same configuration as that of the sensor package 1. The mold 7A is a specific but non-limiting example corresponding to a "protective film" in one embodiment of the disclosure.

[Workings and Effects of Sensor Package 1D]

It is also possible for the sensor package 1D according to the present modification example to achieve effects similar to those of the sensor package 1. In addition, according to the sensor package 1D, the sensor module 2 and the wires 5 and 6 may be provided in the void 7V inside the mold 7A, thus making it possible to space the sensor module 2 and the wires 5 and 6 apart from the mold 7A. This makes it possible to prevent or suppress application of stress to the sensor elements 17 and 18 even in a case, for example, where the mold 7A expands or contracts in association with variation in environmental temperature. In a case where the sensor elements 17 and 18 are in contact with the mold 7A, stress is applied to the sensor elements 17 and 18 due to difference in thermal expansion coefficients, which leads to a possibility that detection accuracy in the sensor elements 17 and 18 may be lowered depending on magnitude of the stress. However, spacing at least the sensor elements 17 and 18 apart from the mold 7A as in the sensor package 1D of the present modification example makes it possible to prevent or suppress the stress, caused by the mold 7A, affecting the sensor elements 17 and 18.

In the sensor package 1D illustrated in FIG. 6, all of the sensor module 2 and the wires 5 and 6 may be housed in the void 7V; however, the disclosure is not limited thereto. In a specific but non-limiting example, at least the sensor elements 17 and 18, for example, may be housed in the void 7V without being in contact with the mold 7A. In a more specific but non-limiting example, the ASICs 15 and 16 may be housed in the void 7V without being in contact with the mold 7A. Suppose that the mold 7A is in contact with the ASICs 15 and 16, difference between a thermal expansion coefficient of the mold 7A and a thermal expansion coefficient of each of the ASICs 15 and 16 causes distortion in the ASICs 15 and 16, causing stress to be applied indirectly to the sensor elements 17 and 18 in some cases. Spacing the ASICs 15 and 16 apart from the mold 7A, however, makes it possible to prevent or suppress the application of such indirect stress. In a yet more specific but non-limiting example, in addition to the sensor elements 17 and 18 as well as the ASICs 15 and 16, the wires 5 and 6 may be housed in the void 7V without being in contact with the mold 7A for a similar reason.

3. Other Modification Examples

The disclosure has been described hereinabove referring to the example embodiment and the modification examples. However, the disclosure is not limited to the example embodiment and the modification examples, and may be modified in a variety of ways. For example, in the foregoing example embodiment and modification examples, the description has been given, by exemplifying the TMR element as the sensor element, of the sensor package that detects the variation in the external magnetic field in association with the displacement of the magnetic body. However, the electronic component package of an embodiment of the disclosure is not limited thereto. The electronic component package of an embodiment of the disclosure may be, for example, a sensor device that detects other physical quantities. Non-limiting examples of the sensor device may include an electric current detection device, a rotation detection device, a relative position detection device, a magnetic compass, and a magnetic switch. The electronic component package of an embodiment of the disclosure may also be a package that includes passive components such as a capacitor, an inductor, and a resistor, in addition to electronic components such as a semiconductor memory.

Factors such as the shape, size, and position of disposition of each component in the sensor package illustrated in figures such as FIG. 1 are merely illustrative, and are not limited thereto. It is not necessary to include all of the components in the sensor package illustrated in figures such as FIG. 1, and any other unillustrated component may be included.

Further, the foregoing example embodiment and modification examples exemplify the case where the two electronic component chips are provided; however, three or more electronic component chips may be provided.

Moreover, the disclosure encompasses any possible combination of some or all of the various embodiments and the modification examples described herein and incorporated herein.

It is possible to achieve at least the following configurations from the above-described example embodiments of the disclosure.

(1)
An electronic component package including:
a base including a first surface and a second surface;
a first plated layer that covers the first surface;
a first electronic component chip provided on the first plated layer with a first insulating layer being interposed therebetween;
a second plated layer that covers the second surface; and
a second electronic component chip provided on the second plated layer with a second insulating layer being interposed therebetween,
the first plated layer and the second plated layer each including a first metal material that is less likely to undergo an ion migration phenomenon than silver.

(2)
The electronic component package according to (1), in which the first metal material includes one or more of gold, palladium, and nickel.

(3)
The electronic component package according to (1) or (2), in which the first plated layer and the second plated layer are integrated.

(4)
An electronic component package including:
a base including a first surface and a second surface;
a first electronic component chip provided on the first surface with a first insulating layer being interposed therebetween; and
a second electronic component chip provided on the second surface with a second insulating layer being interposed therebetween.

(5)
The electronic component package according to any one of (1) to (4), in which the first electronic component chip includes a first application specific integrated circuit and a first sensor.

(6)
The electronic component package according to any one of (1) to (5), in which the second electronic component chip includes a second application specific integrated circuit and a second sensor.

(7)
The electronic component package according to any one of (1) to (6), in which the first insulating layer and the second insulating layer each include an insulating adhesive film.

(8)
The electronic component package according to any one of (1) to (7), in which the first surface and the second surface of the base are located on sides opposite to each other.

(9)
The electronic component package according to any one of (1) to (8), further including:
a first lead spaced apart from the base;
a third plated layer that covers a surface of the first lead; and
a first conductor that couples the third plated layer and a first terminal of the first electronic component chip.

(10)
The electronic component package according to (9), further including:
a second lead spaced apart from each of the base and the first lead;
a fourth plated layer that covers a surface of the second lead; and
a second conductor that couples the fourth plated layer and a second terminal of the second electronic component chip.

(11)
The electronic component package according to (10), further including a protective film that covers the first electronic component chip, the second electronic component chip, a portion of the first lead, a portion of the third plated layer, the first conductor, a portion of the second lead, a portion of the fourth plated layer, and the second conductor.

(12)
The electronic component package according to (11), in which
the protective film has a void therein,
the first electronic component chip includes the first application specific integrated circuit and the first sensor,
the second electronic component chip includes the second application specific integrated circuit and the second sensor, and
at least the first sensor and the second sensor are provided in the void.

(13)

The electronic component package according to any one of (10) to (12), in which the third plated layer and the fourth plated layer each include a second metal material that is less likely to undergo the ion migration phenomenon than the silver.

In the electronic component package according to one embodiment of the disclosure, the first plated layer and the second plated layer each include a metal material that is less likely to undergo an ion migration phenomenon than silver (Ag). Hence, the metal material is less likely to infiltrate into the first insulating layer and the second insulating layer that cover the plated layers to destroy the insulation of the first insulating layer and the second insulating layer.

According to the electronic component package of one embodiment of the disclosure, it is possible to achieve much superior operational reliability.

Although the disclosure has been described in terms of exemplary embodiments, it is not limited thereto. It should be appreciated that variations may be made in the described embodiments by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. Moreover, no element or component in this disclosure is intended to be dedicated to the public regardless of whether the element or component is explicitly recited in the following claims.

What is claimed is:

1. An electronic component package comprising:
    a base including a first surface and a second surface;
    a first plated layer that covers the first surface;
    a first electronic component chip provided on the first plated layer with a first insulating layer being interposed therebetween;
    a second plated layer that covers the second surface; and
    a second electronic component chip provided on the second plated layer with a second insulating layer being interposed therebetween,
    wherein the first plated layer and the second plated layer each include a first metal material that is less likely to undergo an ion migration phenomenon than silver,
    an electric potential of the first electronic component chip and an electric potential of the second component chip are different, and
    the first electronic component chip and the second electronic component chip are electrically insulated from each other, and are not connected to each other with a wire interconnect.

2. The electronic component package according to claim 1, wherein the first metal material includes one or more of gold, palladium, and nickel.

3. The electronic component package according to claim 1, wherein the first plated layer and the second plated layer are integrated.

4. The electronic component package according to claim 1, wherein the first electronic component chip includes a first application specific integrated circuit and a first sensor.

5. The electronic component package according to claim 4, wherein the second electronic component chip includes a second application specific integrated circuit and a second sensor.

6. The electronic component package according to claim 1, wherein the first insulating layer and the second insulating layer each comprise an insulating adhesive film.

7. The electronic component package according to claim 1, wherein the first surface and the second surface of the base are located on sides opposite to each other.

8. The electronic component package according to claim 1, further comprising:
    a first lead spaced apart from the base;
    a third plated layer that covers a surface of the first lead; and
    a first conductor that couples the third plated layer and a first terminal of the first electronic component chip.

9. The electronic component package according to claim 8, further comprising:
    a second lead spaced apart from each of the base and the first lead;
    a fourth plated layer that covers a surface of the second lead; and
    a second conductor that couples the fourth plated layer and a second terminal of the second electronic component chip.

10. The electronic component package according to claim 9, further comprising a protective film that covers the first electronic component chip, the second electronic component chip, a portion of the first lead, a portion of the third plated layer, the first conductor, a portion of the second lead, a portion of the fourth plated layer, and the second conductor.

11. The electronic component package according to claim 10, wherein the protective film has a void therein, the first electronic component chip includes a first application specific integrated circuit and a first sensor, the second electronic component chip includes a second application specific integrated circuit and a second sensor, and at least the first sensor and the second sensor are provided in the void.

12. The electronic component package according to claim 9, wherein the third plated layer and the fourth plated layer each include a second metal material that is less likely to undergo the ion migration phenomenon than the silver.

13. The electronic component package according to claim 1, wherein
    the first electronic component chip includes a first application specific integrated circuit,
    the second electronic component chip includes a second application specific integrated circuit, and
    an electric potential of the first application specific integrated circuit and an electric potential of the second application specific integrated circuit are different.

14. The electronic component package according to claim 1,
    wherein the first plated layer is disposed on a top side of the base, the second plated layer is disposed on a bottom side of the base, and the first plated layer and the second played layer each include a pair of right-angle portions that each partially extend over respective side surfaces of the base, the side surfaces being perpendicular to the top side and the bottom side of the base, and wherein a gap is present between each right-angle portion of the first plated layer and each right-angle portion of the second plated layer.

15. The electronic component package according to claim 1, wherein the first plated layer and the second plated layer are provided separately from each other.

16. The electronic component package according to claim 1, wherein the first plated layer and the second plated layer cover part of both end surfaces of a base, while the first plated layer and the second plated layer are separated from each other in both end surfaces.

17. The electronic component package according to claim 1, wherein a first working voltage of the first electronic component chip is different from a second working voltage of the second electronic component chip.

18. The electronic component package according to claim 1, wherein at least one of the first electronic component chip or the second electronic component chip is embedded in a protective film.

19. The electronic component package according to claim 1, wherein the first electronic component chip includes a first sensor.

20. The electronic component package according to claim 19, wherein the second electronic component chip includes a second sensor.

21. The electronic component package according to claim 1, wherein the first electronic component chip includes a first application specific integrated circuit.

22. The electronic component package according to claim 21, wherein the second electronic component chip includes a second application specific integrated circuit.

23. The electronic component package as claimed in claim 1, wherein the electric potential of the first electronic component chip corresponds to a first working voltage of the first electronic component chip, and the electric potential of the second component chip corresponds to a second working voltage of the second electronic component chip, the first working voltage is different from the second working voltage.

24. An electronic component package comprising:
a base including a first surface and a second surface;
a first electronic component chip provided on the first surface with a first insulating layer being interposed therebetween; and
a second electronic component chip provided on the second surface with a second insulating layer being interposed therebetween,
wherein
an electric potential of the first electronic component chip and an electric potential of the second component chip are different, and
the first electronic component chip and the second electronic component chip are electrically insulated from each other, and are not connected to each other with a wire interconnect.

25. The electronic component package according to claim 24, wherein a first working voltage of the first electronic component chip is different from a working second voltage of the second electronic component chip.

26. The electronic component package according to claim 24, wherein at least one of the first electronic component chip or the second electronic component chip is embedded in a protective film.

27. The electronic component package as claimed in claim 24, wherein the electric potential of the first electronic component chip corresponds to a first working voltage of the first electronic component chip, and the electric potential of the second component chip corresponds to a second working voltage of the second electronic component chip, the first working voltage is different from the second working voltage.

* * * * *